United States Patent
Yap

(10) Patent No.: US 8,927,417 B2
(45) Date of Patent: Jan. 6, 2015

(54) SEMICONDUCTOR PACKAGE SIGNAL ROUTING USING CONDUCTIVE VIAS

(71) Applicant: Weng Foong Yap, Phoenix, AZ (US)

(72) Inventor: Weng Foong Yap, Phoenix, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 70 days.

(21) Appl. No.: 13/718,081

(22) Filed: Dec. 18, 2012

(65) Prior Publication Data

US 2014/0167262 A1   Jun. 19, 2014

(51) Int. Cl.

| | |
|---|---|
| H01L 21/4763 | (2006.01) |
| H01L 21/00 | (2006.01) |
| H01L 21/44 | (2006.01) |
| H01L 21/56 | (2006.01) |
| H01L 23/498 | (2006.01) |
| H01L 21/48 | (2006.01) |
| H01L 23/00 | (2006.01) |
| H01L 25/10 | (2006.01) |

(52) U.S. Cl.
CPC .......... *H01L 21/56* (2013.01); *H01L 23/49816* (2013.01); *H01L 21/485* (2013.01); *H01L 24/85* (2013.01); *H01L 24/97* (2013.01); *H01L 24/32* (2013.01); *H01L 24/45* (2013.01); *H01L 24/48* (2013.01); *H01L 24/73* (2013.01); *H01L 25/105* (2013.01); *H01L 2224/32225* (2013.01); *H01L 2224/32245* (2013.01); *H01L 2224/45124* (2013.01); *H01L 2224/45144* (2013.01); *H01L 2224/45147* (2013.01); *H01L 2224/45164* (2013.01); *H01L 2224/48227* (2013.01); *H01L 2224/48247* (2013.01); *H01L 2224/73265* (2013.01); *H01L 2224/85947* (2013.01); *H01L 2224/97* (2013.01); *H01L 2225/1023* (2013.01); *H01L 2225/1029* (2013.01); *H01L 2225/1058* (2013.01); *H01L 2924/15311* (2013.01)
USPC .......... 438/637; 438/106; 438/107; 438/108; 438/109; 438/110; 438/124; 438/127; 438/128; 438/629; 438/668; 438/672; 438/674; 438/675

(58) Field of Classification Search
None
See application file for complete search history.

(56) References Cited

U.S. PATENT DOCUMENTS 6,444,563 B1   9/2002   Potter et al.
6,762,495 B1   7/2004   Reyes et al.

OTHER PUBLICATIONS

McCormick et al.; "Assembly and Reliability Assessment of Fine Pitch TMV Package on Package (PoP) Components"; Proceedings of the SMTA International Conference, San Diego; Oct. 4-8, 2009; 8 Pages; Practical Components.

*Primary Examiner* — Steven Loke
*Assistant Examiner* — Juanita B Rhodes
(74) *Attorney, Agent, or Firm* — Jonathan N. Geld

(57) ABSTRACT

A mechanism is provided by which signal travel distance within and between semiconductor device packages is reduced and substrate size and complexity can be reduced. This capacity is provided by virtue of a conductive via that intersects a wire bond molded within a package substrate. The via provides a direct electrical connection between an external signal transmitter or receiver and the points connected by the wire bond, and thereby avoiding the need for the signal to transit built up interconnects in the semiconductor device package. Conductive vias can provide connectivity through or to a package substrate, and can be through vias or blind vias. The conductive via is formed by either mechanical or laser drilling, and is filled using standard fill techniques, and is therefore readily incorporated into a package production flow.

13 Claims, 8 Drawing Sheets

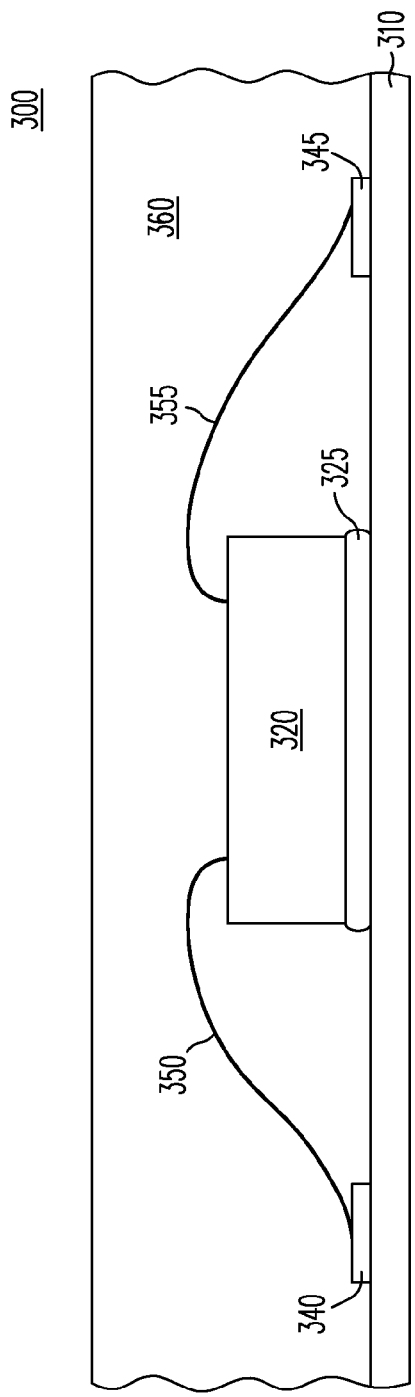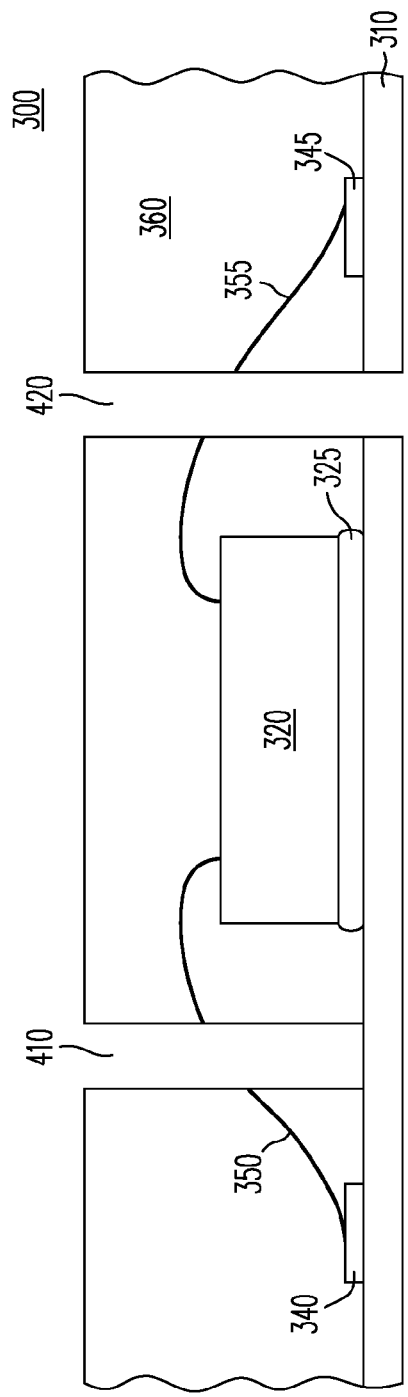

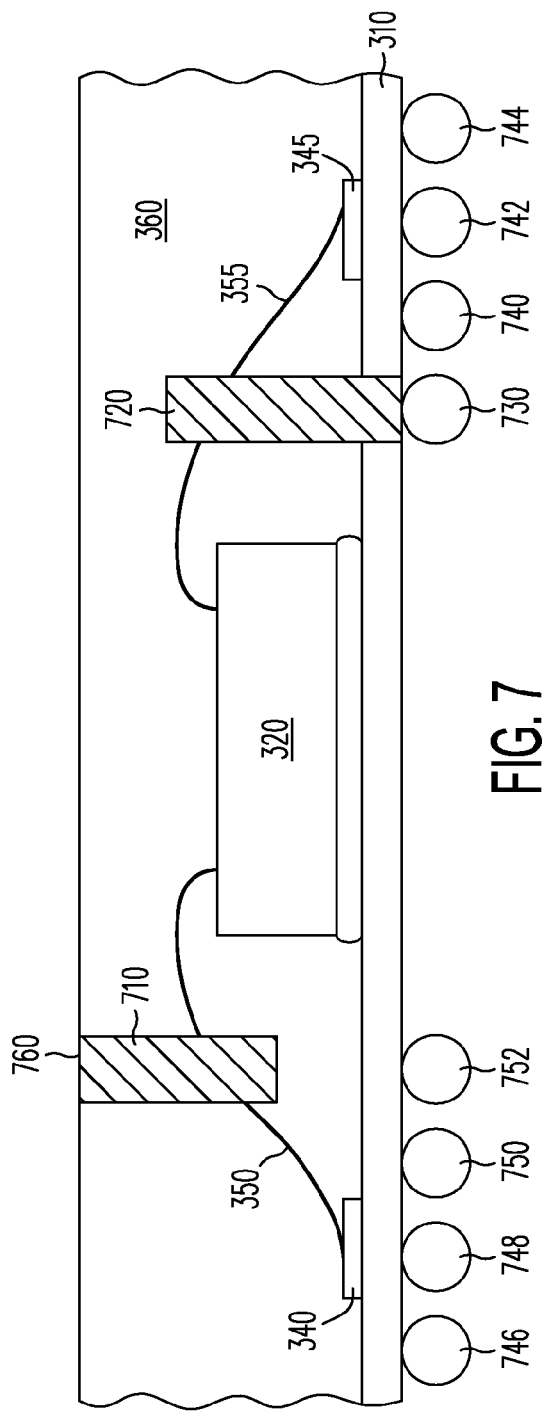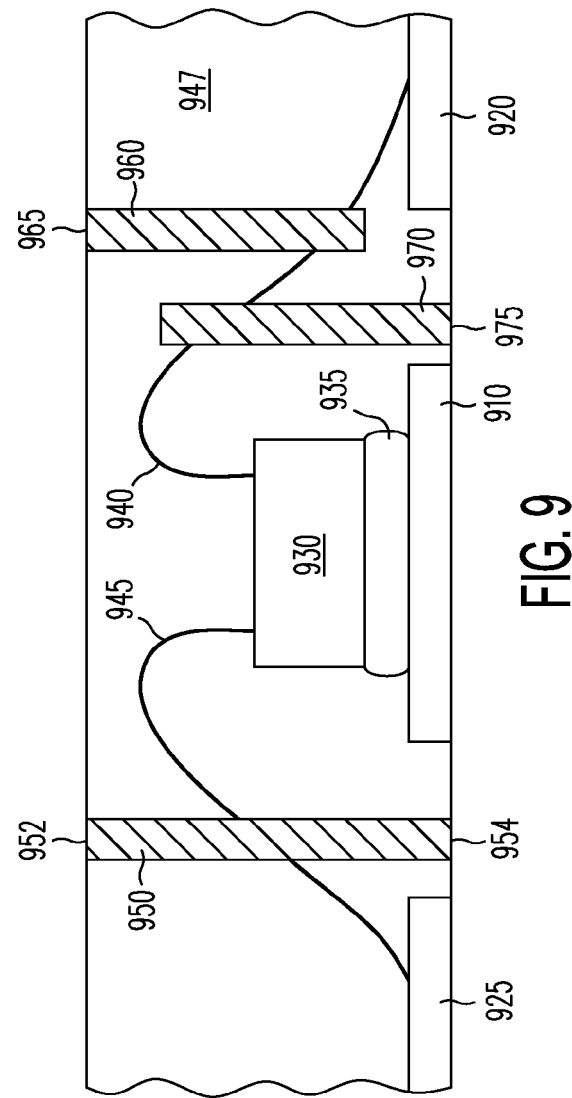

SEMICONDUCTOR PACKAGE SIGNAL ROUTING USING CONDUCTIVE VIAS

BACKGROUND

1. Field

This disclosure relates generally to semiconductor device packaging, and more specifically, to using conductive vias to bypass device interconnects by directly electrically coupling with molded bond wires.

2. Related Art

Package-on-package semiconductor device package connections have been adopted for three-dimensional integration of logic and memory devices within consumer devices, such as mobile handsets and portable multimedia devices. Stacking of semiconductor device packages that package-on-package techniques permit allows for increased amounts of logic and memory in a smaller space.

Existing methods of forming a package-on-package stack may not satisfy next generation applications that may require reduced memory interface pitches, higher memory interface pin-outs, reduced package thickness, tight warpage control, and higher levels of integration within the base package. Alternative methods to package-on-package techniques have included using through mold vias and through silicon vias to increase numbers of connections in devices. But these alternatives still do not resolve issues involved with wire-bond device package such as long travel distance for routing (e.g., die to substrate, substrate to solder ball, solder ball to substrate, substrate to die), which results in, for example, increased resistance and lower speed, and higher cost for the substrate design and manufacturing (e.g., bigger size, increased material usage).

It is therefore desirable to have a mechanism by which packages incorporating devices having wire bond connections can be included in three-dimensional stacking configurations while providing capacity for decreased size, decreased cost, faster signal propagation, and the like.

BRIEF DESCRIPTION OF THE DRAWINGS

The present invention may be better understood, and its numerous objects, features, and advantages made apparent to those skilled in the art by referencing the accompanying drawings.

FIG. 3 is a simplified block diagram providing a cross-section view of a portion of a semiconductor device package, usable by embodiments of the present invention.

FIG. 4 is a simplified block diagram providing a cross-section view of the portion of the semiconductor device package at a later stage in processing to that of FIG. 3.

FIG. 7 is a simplified block diagram providing a cross-section view of the portion of the semiconductor device package at a later stage in processing to that of FIG. 6.

FIG. 9 is a simplified block diagram providing a cross-section view of a quad-flat no-leads (QFN) package, incorporating an embodiment of the present invention.

The use of the same reference symbols in different drawings indicates identical items unless otherwise noted. The figures are not necessarily drawn to scale.

DETAILED DESCRIPTION

Embodiments of the present invention provide a mechanism by which signal travel distance within and between semiconductor device packages is reduced and substrate size and complexity can be reduced. Embodiments provide this capacity by virtue of a conductive via that intersects a wire bond molded within a package substrate. The via provides a direct electrical connection between an external signal transmitter or receiver and the points connected by the wire bond, and thereby avoiding the need for the signal to transit built up interconnects in the semiconductor device package. Conductive vias can provide connectivity through or to a package substrate, and can be through vias or blind vias. The conductive via is formed by either mechanical or laser drilling, and is filled using standard fill techniques, and is therefore readily incorporated into a package production flow.

Package-on-package (PoP) has been commonly adopted for three-dimensional integration of logic and memory within a variety of portable devices. PoP techniques allow for a higher density of logic and memory devices to be incorporated in a particular footprint of, for example, a printed circuit board within the consumer device. But current PoP methods have drawbacks, as discussed more fully below.

Figure 1:
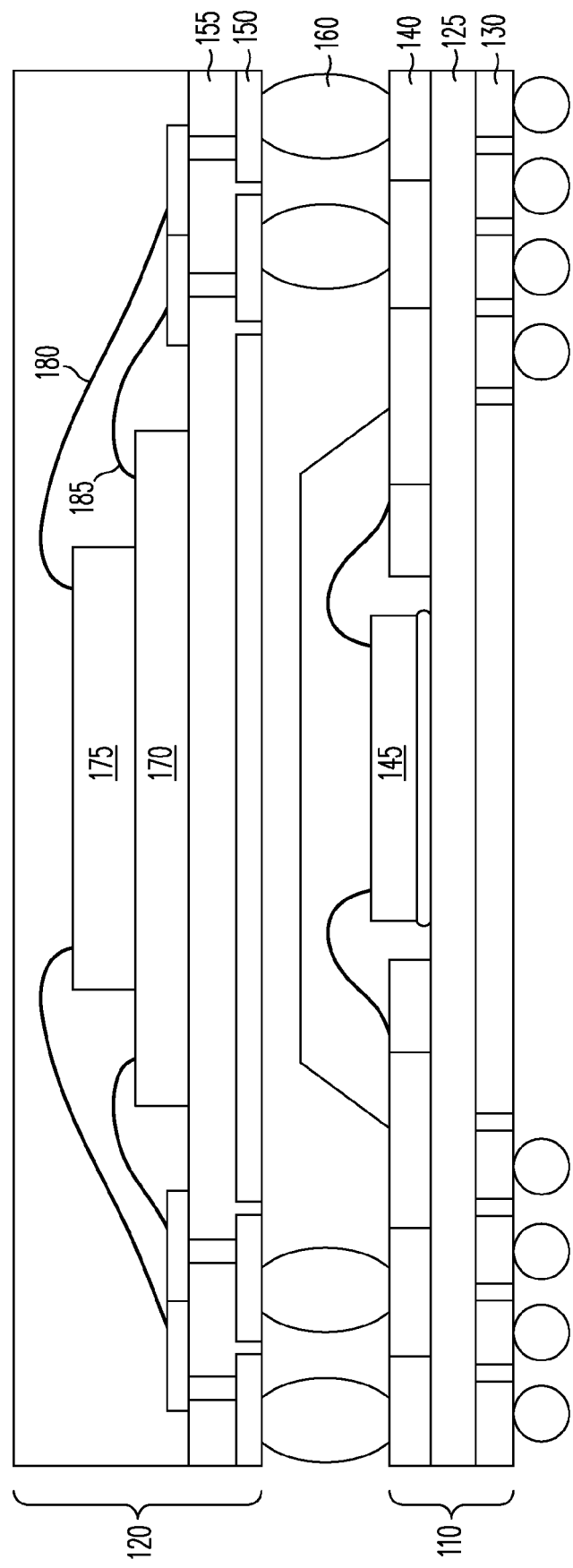
FIG. 1 is a simplified block diagram illustrating a cross-section of an example of a package-on-package stacking configuration.

FIG. 1 is a simplified block diagram illustrating a cross-section of an example of a PoP configuration. Bottom package 110 is electrically coupled to top package 120. Bottom package 110 includes a bottom package substrate 125 having a bottom surface interconnect 130 and a top surface interconnect 140. Bottom surface interconnect 130 and top surface interconnect 140 are built up on bottom package substrate 125 using methods known in the art. The bottom surface interconnect and the top surface interconnect can be communicatively coupled through bottom package substrate 125 by means of, for example, through vias, or a PCB interconnect within the substrate. A semiconductor device die 145 can be mounted on substrate 125 and electrically coupled to a signal pad that are a part of top surface interconnect 140.

Top surface interconnect 140 can provide signal pads for communicative coupling with a bottom surface interconnect 150 of top package 120. Such communicative coupling can be provided by, for example, solder balls 160, as illustrated. As with bottom package 120, bottom surface interconnect 150 of top package 120 is built up on a top package substrate 155. Molded within the top package can be semiconductor device die such as die 170 and 175 along with signal pads that are coupled to die 170 and 175 through the use of wire bonds 180 and 185.

As illustrated in FIG. 1, an advantage of this vertical combination of different packages is printed circuit board area savings. PoP packaging can provide a good solution for applications that require more features in less space, such as in consumer devices including digital cameras, PDAs, MP3 players, and the like.

One disadvantage of PoP configurations is that the bottom package needs electrical routing outside the mold area for the substrate, and hence a larger substrate spacing outside the mold (e.g., in the area of bottom package 110 at which solder balls 160 are connected). Another disadvantage is that the top package should be equal or larger in size than the bottom package for stacking, resulting in restrictions upon the top package size. A further disadvantage of traditional PoP methods is a longer travel distance for signal routing that results in higher electrical resistance, lower speed, and other impacts of long signal paths. This travel distance can include, for example, the path from semiconductor device die 145 to top surface interconnect 140, from the top surface interconnect 140 to a solder ball 160, from solder ball 160 to bottom surface interconnect 150, and then the routing from bottom surface interconnect 150 through substrate 155 to wire bonds 180 or 185, and wire bonds 180 or 185 to device die 170 or 175. Further, the larger size and top side routing of the bottom package in a typical PoP configuration can result in a higher costs for the substrate design and manufacture (e.g., more substrate material used, additional routing material required, and the like). Finally, there can be challenges in reliably assembling a PoP configuration due to warpage of the package substrates. Such warpage can occur due to differences in coefficient of thermal expansion (CTE) between plastic substrate and mold material in a package. CTE of a plastic substrate can be significantly higher than that of the mold material, which can cause warpage of the plastic substrate. Differences in warpage of packages to be stacked can cause open connections between the packages.

Figure 2:
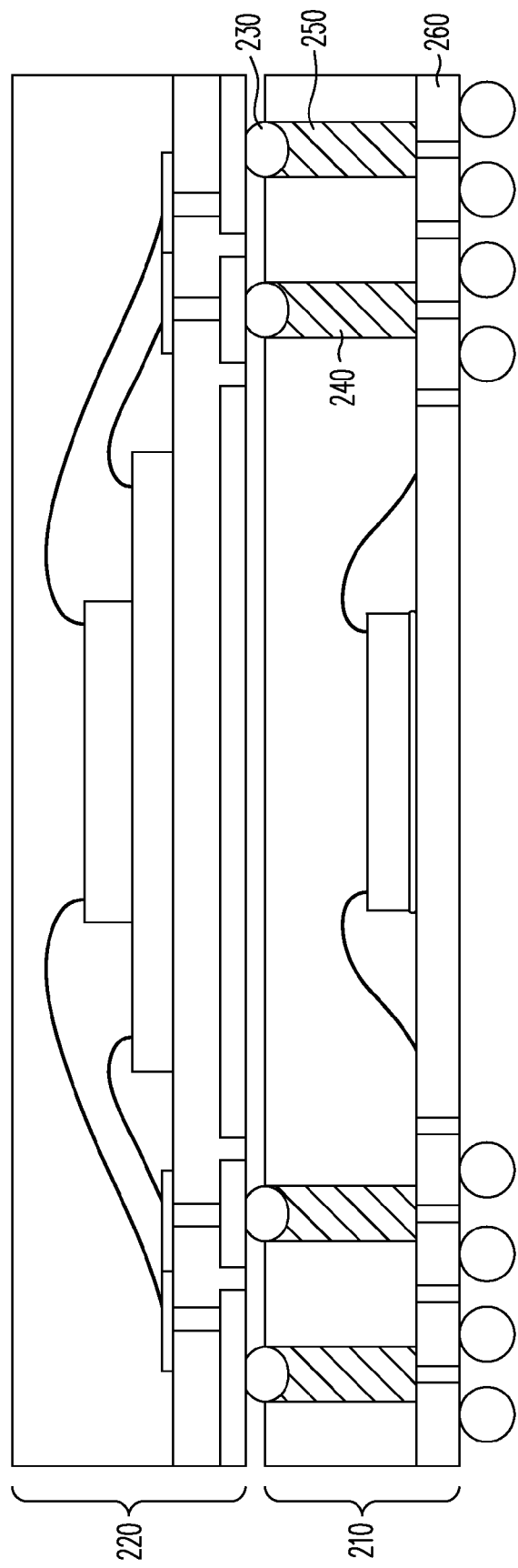
FIG. 2 is a simplified block diagram providing a cross-section view of an example of three-dimensional semiconductor device package stacking using through-mold via technology.

FIG. 2 is a simplified block diagram providing a cross-section view of an example of three-dimensional semiconductor device package stacking using through-mold via technology. A bottom package 210 is electrically coupled to a top package 220 through a set of solder balls 230. Rather than having solder balls 230 connected to a top side interconnect, such as top surface interconnect 140 in FIG. 1, the stacked packages of FIG. 2 provide for electrical coupling of the solder balls to one or more vias extending through the molding material of bottom package 210 (e.g. vias 240 and 250). A typical method for forming vias is to drill, either mechanically or using a laser, through the encapsulant material of the package. Subsequent to drilling, the holes are filled with a conductive fill material, such as, for example, solder paste.

By connecting a top package to a bottom package using conductive vias, a process used for forming the bottom package can be simplified. For example, a top surface interconnect 140 that is formed outside of the molding area of a package is unnecessary. The routing can be built completely within the molding material and the bottom surface interconnect (e.g., bottom surface interconnect 260 of bottom package 210). Further, a top package can be a smaller size than a bottom package when using through vias for conductivity, because the connection surfaces of the through vias can be anywhere within the perimeter of the top surface of the bottom package. This is contrasted with the requirement for providing interconnect on a top surface of a bottom package outside of the molded area, as in FIG. 1. In addition, there is less potential for substrate warpage of the packages, since the top package is typically mounted much closer to the top surface of the bottom package (e.g., through the use of solder reflow techniques).

Nonetheless, there is still substantial distance for routing signals, since the signals will traverse at least two substrates, that of the top package and the bottom package. Further, via connections only partially solve the issues associated with bigger sized substrates and associated routing material on those substrates.

Embodiments of the present invention utilize the advantages of the conductive via connections illustrated in FIG. 2 to provide a direct connection between selected wire bond connections and the exterior of a package. This avoids the additional distance of signal travel through the interconnect on the substrate. Likewise, the interconnect can be simplified by not requiring routing of that signal for input/output. As will be discussed in greater detail below, a combination of through vias, which pass through the entirety of the encapsulant for a package, and blind vias, which have ends exposed on only one side of a package, are utilized to provide desired conductivity.

FIG. 3 is a simplified block diagram providing a cross-section view of a portion of a semiconductor device package 300, usable by embodiments of the present invention. A package substrate 310 is provided, on which a semiconductor device die 320 is mounted using an adhesive film 325. Package substrate 310 can be made from a variety of materials standard in the art of semiconductor packaging and suitable to the application, including one or more dielectric layers. Typical dielectric materials for the substrate include woven glass and epoxy compounds that provide both electrical insulation as well as dimensional stability. The package substrate can also include die connection pads 340 and 345 for connecting die electrical contacts to an interconnect formed on and within the package substrate. Conductive materials used to form die connection pads 340 and 345, as well as the interconnect within the package substrate, are typical of those used in the art and include, for example, copper foil.

Semiconductor device die 320 is affixed to the package substrate with an active surface exposed (e.g., facing away from the surface of the package substrate). The "active surface" of semiconductor device die 320 is a surface of the die having bond pads (not shown). Adhesive film 325, used to affix semiconductor device die 320 onto substrate 310, can be a variety of types of adhesive layers that can withstand the packaging processing without separating from either the die or the package substrate. In addition, the die bond pads on the active surface of semiconductor device die 320 are coupled to wire bond pads 340 and 345 through associated wire bonds 350 and 355, respectively. The wire bonds are formed using wire bonding techniques known in the art and suitable to the application. The metal forming the wire bonds can include gold, copper, aluminum, palladium, and alloys of the same.

Subsequent to forming the wire bonds, a molding material is applied to the structures affixed to package substrate 310 (e.g., semiconductor device die 320 and wire bonds 350 and 355), forming an encapsulant 360 that encapsulates the structures within the molding material and forms a panel or a strip with multiple packages. The molding material can be any appropriate encapsulant including, for example, silica-filled epoxy molding compounds, plastic encapsulation resins, and other polymeric materials such as silicones, polyimides, phenolics, and polyurethanes. The molding material can be applied by a variety of standard processing techniques used in encapsulation including, for example, printing, pressure molding and spin application. Once the molding material is applied, the panel or strip can be cured by exposing the materials to certain temperatures for a period of time, or by applying curing agents, or both. In a typical encapsulation process, a depth of encapsulant 360 will exceed a maximum height of structures embedded in the molding material (e.g., the maximum height above substrate 310 of wire bonds 350 and 355).

FIG. 4 is a simplified block diagram providing a cross-section view of the portion of semiconductor device package 300 at a later stage in processing to that of FIG. 3. As illustrated, a hole 410 and a hole 420 are formed through encapsulant 360. Hole 410 runs from the top surface of encapsulant 360, through wire bond 350 and extends to the top surface of package substrate 310. Hole 420 runs from the top surface of encapsulant 360, through wire bond 355, and extends through to the bottom surface of package substrate 310. Holes 410 and 420 can be formed by a mechanical drilling or by a laser drilling process known in the art. Where holes 410 and 420 pass through the respective wire bonds 350 and 355, severed ends of the wire bonds are exposed on the surfaces of the holes.

Figure 5:
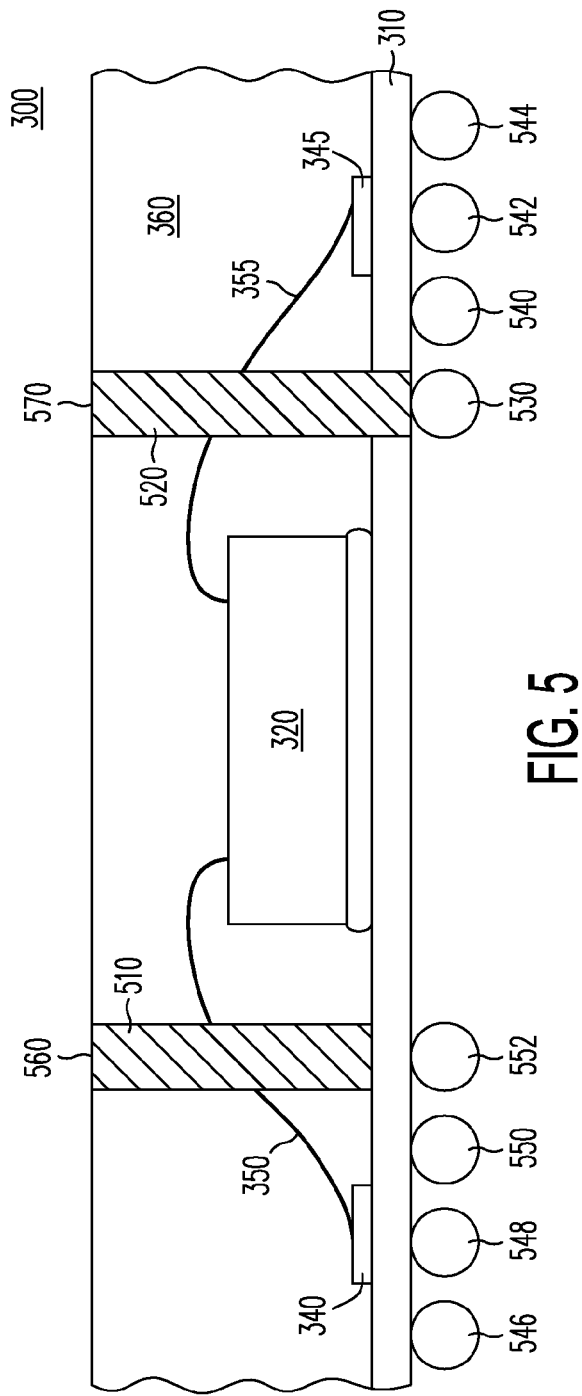
FIG. 5 is a simplified block diagram providing a cross-section view of the portion of the semiconductor device package at a later stage in processing to that of FIG. 4.

FIG. 5 is a simplified block diagram providing a cross-section view of the portion of semiconductor device package 300 at a later stage in processing to that of FIG. 4. Holes 410 and 420 are filled with a conductive material to provide conductive vias 510 and 520. The conductive material can include any conductive fill material used in the art and can include, for example, solder paste. Conductive via 510 provides a conductive path from a contact surface 560 on the top surface of encapsulant 360 to package substrate 310. At the location where conductive via 510 contacts package substrate 310 there can be a contact pad to the interconnect formed on package substrate 310, so that signals from the conductive via can be provided to connections to and from the interconnect. Further, conductive via 510 provides electrical connectivity to both severed ends of wire bond 350, which serves a dual purpose of reconnecting the broken wire bond, and providing a signal path from contact surface 560 to wire bond 350 and to an interconnect formed in or on package substrate 310.

Similarly, conductive via 520 provides a conductive path from contact surface 570 on the top surface of encapsulant 360 to a solder ball 530. Conductive via 520 provides electrical connectivity to both severed ends of wire bond 355, which provides a signal path from contact surface 570 to wire bond 355 and from solder ball 530 to wire bond 355, and from contact surface 570 to solder ball 530. In addition, conductive via 520 can provide a signal path to and from an interconnect formed in or on package substrate 310 using a connection at the region the conductive via passes through the substrate.

Additional solder balls can be provided for signal input and output to the interconnect of semiconductor device package 300 (e.g., solder balls 540, 542, 544, 546, 548, 550, and 552). These solder balls (or other types of connections to an interconnect on package substrate 310) can also receive or transmit signals to or from conductive vias 510 and 520 if those conductive vias are electrically coupled to the package substrate interconnect.

With both conductive vias 510 and 520, a signal path is provided to both wire bonds 350 and 355, respectively, that avoids passage through any substrate interconnect. This can significantly decrease an amount of time for a signal to pass from the wire bond connections (e.g., a bond pad on semiconductor device die 320) to a device external to the package, by virtue of the signal not needing to pass through the substrate of semiconductor device package 300, either at via surface contacts 560 or 570, or solder ball 530. It should be noted that embodiments of the present invention are not limited to the use of solder balls (e.g., ball grid array packages), and other conductive connection means can be used (e.g., land grid array packages with flat pad contacts). Further, a variety of electrical connection means can be used to electrically couple external devices to surface contacts 560 and 570.

Figure 6:
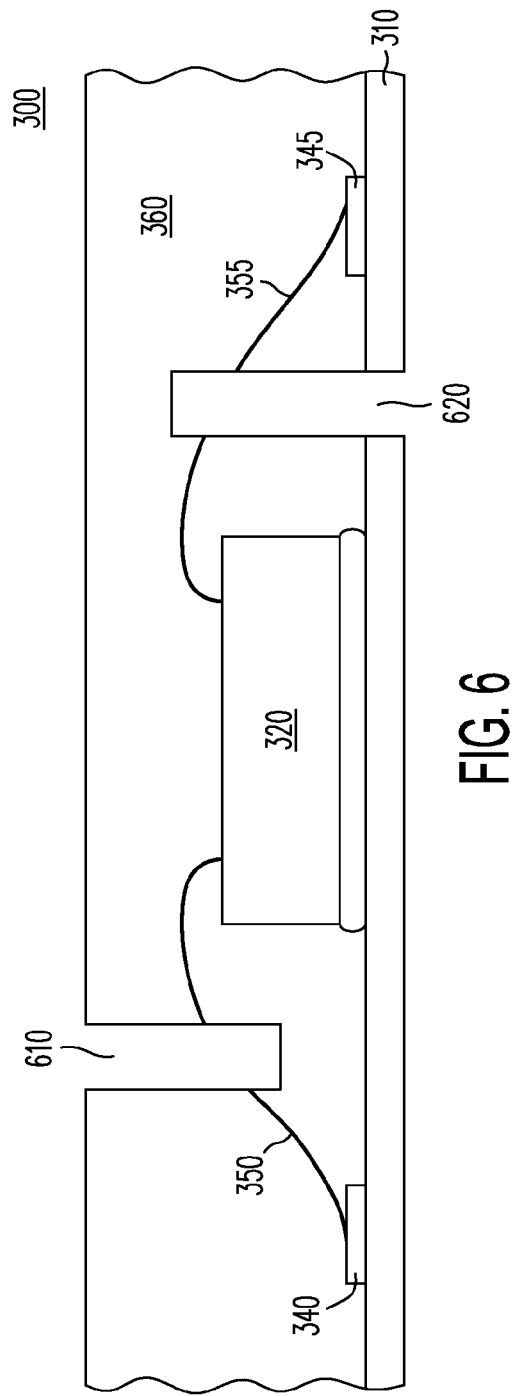
FIG. 6 is a simplified block diagram providing a cross-section view of the portion of a semiconductor device package at an alternative later stage of processing to that illustrated in FIG. 4.

FIG. 6 is a simplified block diagram providing a cross-section view of the portion of a semiconductor device package 300 at an alternative later stage of processing to that illustrated in FIG. 4. As illustrated, a hole 610 and a hole 620 are formed in a portion of encapsulant 360. Hole 610 runs from the top surface of encapsulant 360 and through wire bond 350. Hole 610 does not extend to substrate 310. Hole 620 runs from the bottom surface of package substrate 310, into encapsulant 360, and through wire bond 355. Hole 620 does not extend to the top surface of encapsulant 360. Holes 610 and 620 can be formed by a mechanical drilling or by a laser drilling process known in the art of forming blind vias for semiconductor device packaging. Where holes 610 and 620 pass through the respective wire bonds 350 and 355, severed ends of the wire bonds are exposed on the surfaces of the holes.

FIG. 7 is a simplified block diagram providing a cross-section view of the portion of semiconductor device package 300 at a later stage in processing to that of FIG. 6. Holes 610 and 620 are filled with a conductive material to provide conductive vias 710 and 720. As with the embodiment in FIG. 5, the conductive material can include any conductive fill material used in the art of forming through vias and can include, for example, solder paste. Conductive via 710 provides a conductive path from a contact surface 760 on the top surface of encapsulant 360 to wire bond 350. Conductive via 710 provides electrical connectivity to both severed ends of wire bond 350, which reconnects the broken wire bond, and provides a signal path from contact surface 760 to wire bond 350.

Similarly, conductive via 720 provides a conductive path from solder ball 730 to both severed ends of wire bond 355. Thus, conductive via 720 provides a signal path to wire bond 355 from solder ball 730. Conductive vias 710 and 720 are blind vias. As with the embodiment of FIG. 5, signal paths are provided to both wire bond 350 and 355 that avoid passage through a substrate interconnect of semiconductor device package 300. Additional solder balls can be provided for signal input and output to the interconnect of semiconductor device package 300 (e.g., solder balls 740, 742, 744, 746, 748, 750, and 752).

Embodiments of the present invention provide for a variety of three-dimensional packaging configurations that can take advantage of the simplified signal routing from the surface of the package to the wire bond connectors. Further, less expensive substrates can be used since a reduction in substrate routing is made possible, especially when using a blind via such as conductive via 710 that does not contact or impact the package substrate.

Figure 8:
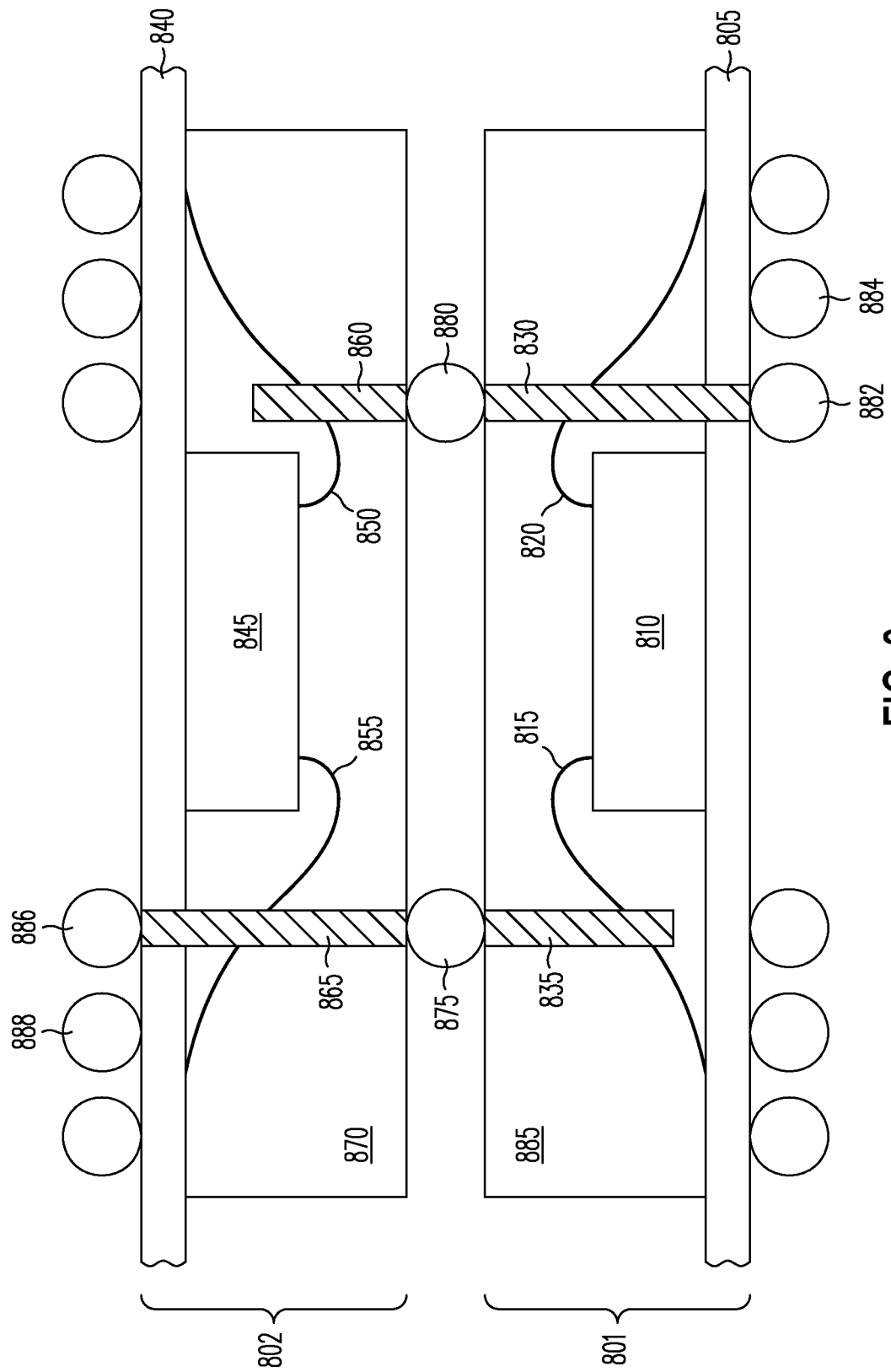
FIG. 8 is a simplified block diagram providing a cross-section view of a three-dimensional stacked package configuration, using embodiments of the present invention.

FIG. 8 is a simplified block diagram providing a cross-section view of an example three-dimensional stacked package configuration using embodiments of the present invention. A bottom package 801 is electrically coupled to a top package 802 through, for example, solder balls 875 and 880. Bottom package 801 includes a package substrate 805 having a semiconductor device die 810 mounted thereon. Semiconductor device die 810 is electrically coupled to contact pads on package substrate 805 by wire bonds 815 and 820. The components of bottom package 801 are encapsulated by encapsulant 825. A conductive via 830 is formed from a top surface of encapsulant 825, through wire bond 820, and through substrate 805. A conductive via 835 is formed from a top surface of encapsulant 825 through wire bond 815, but not to or through substrate 805 (i.e., conductive via 835 is a blind via).

Similarly, top package 802 includes a package substrate 840 having a semiconductor device die 845 mounted thereon. Semiconductor device die 840 is electrically coupled to contact pads on package substrate 840 by wire bonds 850 and 855. The components of top package 802 are encapsulated by encapsulant 870. A conductive via 860 is formed from a top surface of encapsulant 870 through wire bond 850, but not to or through substrate 840 (i.e., conductive via 860 is a blind via). A conductive via 865 is formed from a top surface of encapsulant 870, through wire bond 855, and through substrate 840.

In the illustrated example, semiconductor device packages 801 and 802 are stacked in a manner that permits electrical coupling between conductive via 835 and conductive via 865, using solder ball 875. Similarly, conductive via 830 and conductive via 860 are electrically coupled using solder ball 880. Through these couplings, connections are made between wire bonds 815 and 855, as well as wire bonds 820 and 850, both of which avoid passage of signals through a substrate interconnect layer. In an alternative stacking configuration, solder balls 875 and 880 can be eliminated and the surface contacts of conductive via 865 and 835, and 860 and 830, can be electrically coupled, thereby forming a lower profile stack and aiding in eliminating package warpage.

Additional solder balls can be provided (e.g., 882, 884, 886, and 888), some of which can provide direct signal connections to wire bonds (e.g., solder ball 882 to wire bond 820 using conductive via 830, and further to wire bond 850 using conductive via 860).

The above figures illustrate use of embodiments of the present invention in wire bonded semiconductor device packages in a ball grid array (BGA) type package. It should be understood that embodiments of the present invention are not limited to use in BGA packages. As discussed above, mount packages such as land grid array can also incorporate embodiments of the present invention. Further, lead frame based packages can also incorporate embodiments of the present invention (e.g., through-hole packages [SIP, DIP, QIP], surface flat packages [QFN and QFP], and small outline packages [TSOP and SOIC]).

FIG. 9 is a simplified block diagram providing a cross-section view of a quad-flat no-leads (QFN) package incorporating an embodiment of the present invention. The illustrated package provides a lead frame incorporating a die pad 910 and leads 920 and 925. A semiconductor device die 930 is coupled to die pad 910 using an adhesive film or solder layer 935. Bond pads on an active surface of semiconductor device die 930 are coupled to leads 920 and 925 by wire bonds 940 and 945, respectively. The QFN package is formed by encapsulating the components in a mold compound to form encapsulant 947.

Subsequent to formation and curing of encapsulant 947, conductive vias are formed in the encapsulant. A through via 950 is formed that can electrically couple wire bond 945 to contact surfaces 952 and 954. A blind via 970 is formed that electrically couples wire bond 940 to contact surface 975, and similarly a blind via 960 is formed that electrically couples wire bond 940 to contact surface 965. By incorporating the conductive vias to a QFN-type package, input/output of the device can be re-routed to non-lead areas, and thereby provide additional flexibility to these types of devices.

Figure 10:
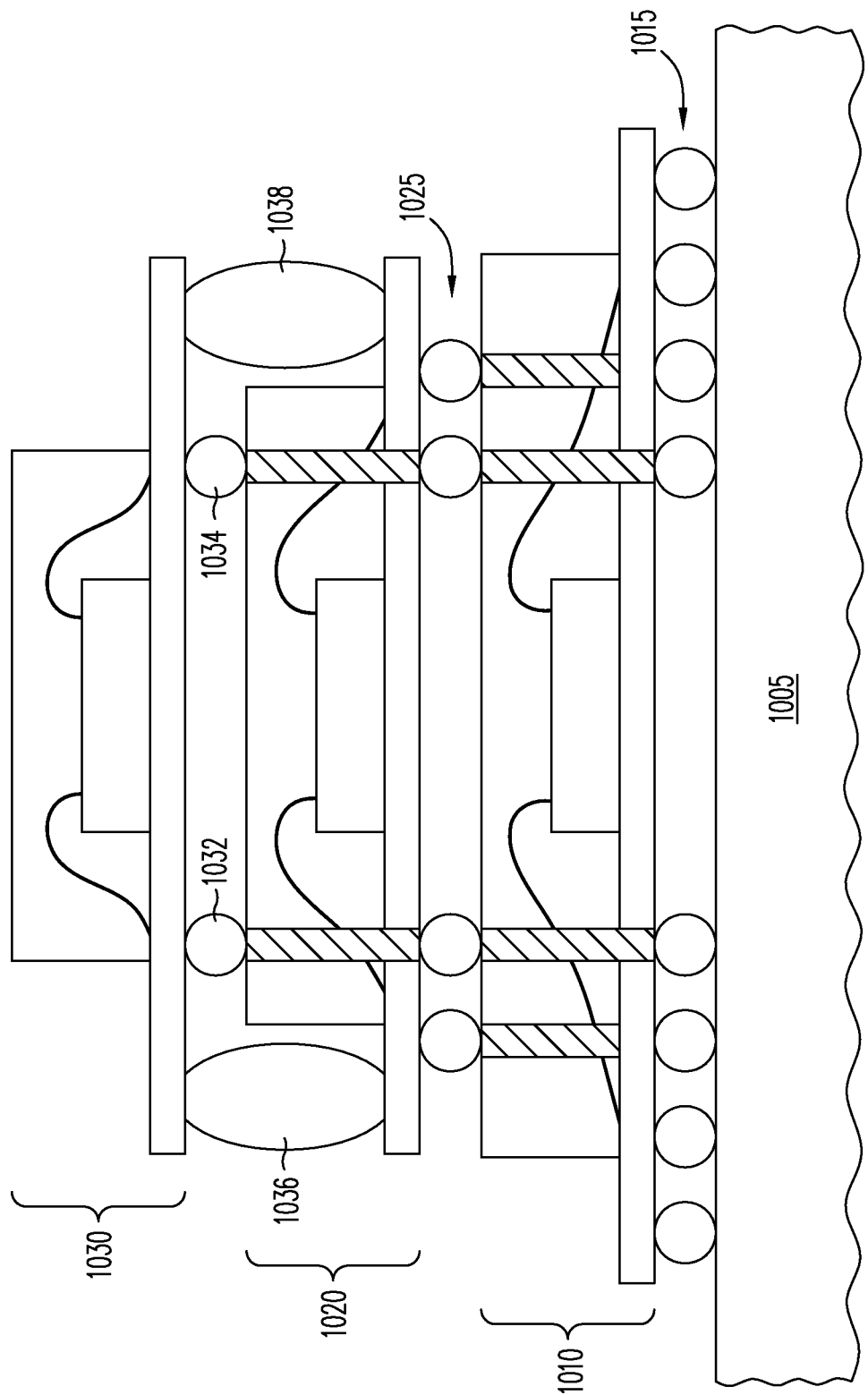
FIG. 10 is a simplified block diagram providing a cross-section view of a stacked package configuration, using embodiments of the present invention.

FIG. 10 is a simplified block diagram providing a cross-section view of a stacked package configuration using an embodiment of the present invention. FIG. 10 illustrates that, unlike with traditional stacked package configurations, top packages need not be the same size (or bigger) than the packages lower on the stack. FIG. 10 provides an illustration of three packages mounted on a printed circuit board (PCB) 1005. Package 1010 is electrically coupled to PCB 1005 by means of solder balls 1015. Package 1020 is electrically coupled to package 1010 by means of solder balls 1025. Solder balls 1025 are coupled to conductive vias within package 1010. The substrate of package 1020 is smaller in cross-sectional length than the substrate of package 1010. Package 1030 is electrically coupled to package 1020 by means of both solder balls 1032 and 1034 and additional connections 1036 and 1038. While package 1030 has a substrate that is substantially the same cross-sectional length as that of package 1020, package 1030 is connected by more than solder balls coupled to conductive vias in package 1020. This illustrates that packages can be electrically coupled by other means than just the conductive via contact surfaces, as the application requires.

Figure 11:
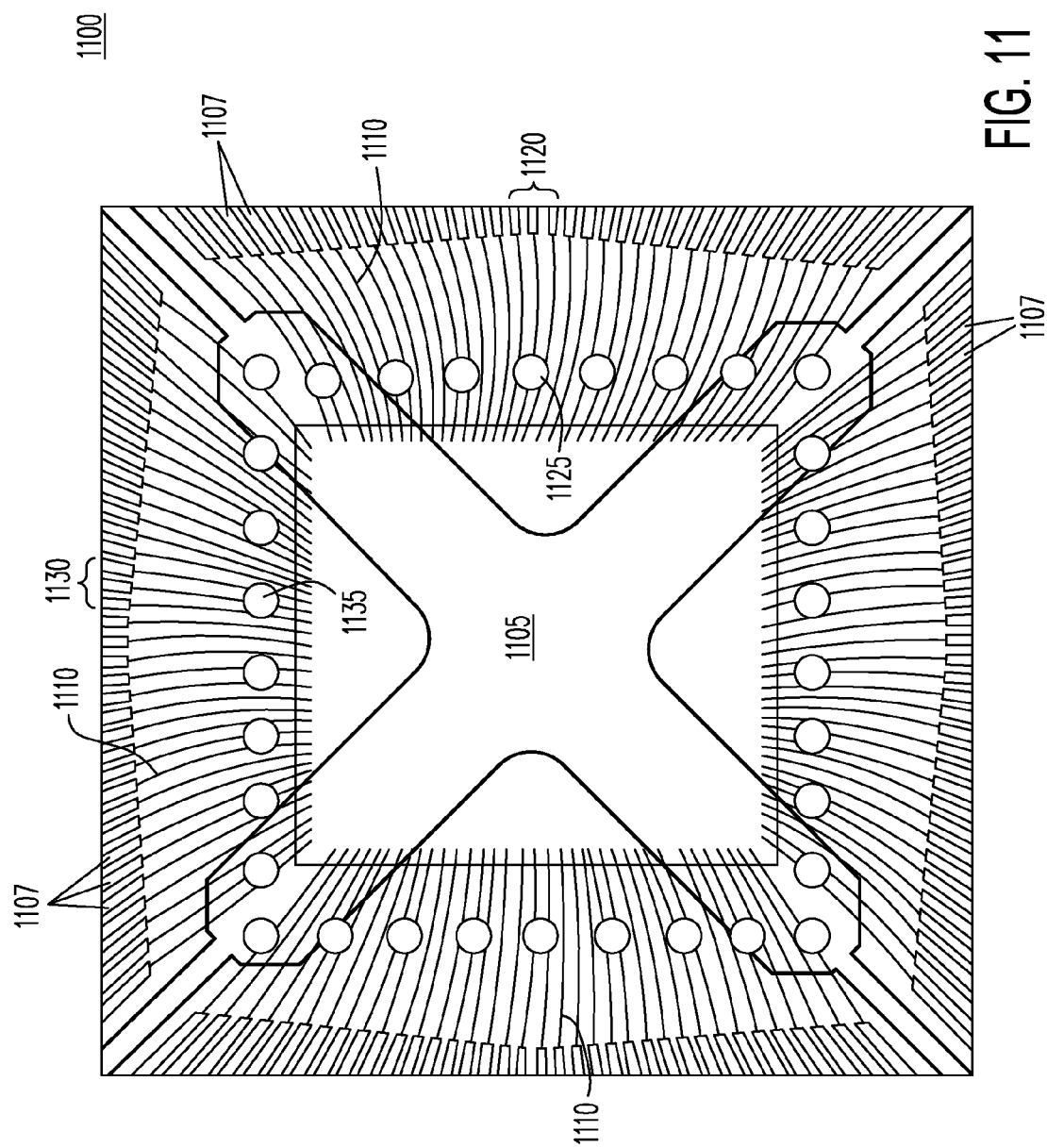
FIG. 11 is a simplified block diagram illustrating a plan view of one embodiment of a semiconductor device package incorporating embodiments of the present invention configured to electrically couple a plurality of wire bonds.

FIG. 11 is a simplified block diagram illustrating a plan view of one embodiment of a semiconductor device package incorporating embodiments of the present invention configured to electrically couple a plurality of wire bonds. Semiconductor device package 1100 includes a semiconductor device 1105 coupled to a plurality of package leads 1107 by corresponding wire bonds 1110. A subset of wire bonds 1120 are electrically coupled to each other by a conductive via 1125. As with previously discussed embodiments, conductive via 1125 provides one or more surface contacts for electrically coupling to the set of wire bonds by an external device. Similarly, a subset of wire bonds 1130 are electrically coupled to each other by a conductive via 1135.

FIG. 11 illustrates a mechanism enabled by embodiments of the present invention to couple wire bonded leads to one another without use of a built up package interconnect. In order to perform such coupled routing, package design considerations will need to be taken into account during design of the device die. Further, wire bond pitch will factor into whether the conductive via can be sufficiently targeted to avoid neighboring wire bonds that are not desired to be coupled. Coupling using conductive vias in this manner may be preferable in a configuration using thicker wire bonds (e.g., greater than 1 mil) in a non-fine pitch configuration.

By now it should be appreciated that there has been provided a method for packaging an electronic device assembly that includes: electrically coupling an electronic device to one or more signal pads by using wire bonds; forming an encapsulant over and around sides of the electronic device and over and around the wire bonds and signal pads to provide and encapsulated electronic device assembly having first and second opposing major surfaces; drilling a hole from one of the first or second major surface toward the opposing major surface where the whole severs a wire bond electrically coupling the electronic device to a signal pad of the one or more signal pads; filling the hole with a conductive material to form a conductive via having a contact surface at or near the major surface from which the hole is drilled. The conductive via is formed to be in electrical contact with the severed ends of the severed wire bond and the conductive via electrically couples the contact surface with the severed ends of the severed wire bond.

One aspect of the above embodiment further includes providing a package substrate including the one or more signal pads and placing the electronic device in an area of the package substrate for the electronic device assembly. Forming the encapsulant further includes forming the encapsulant over the package substrate in the area for the electronic device assembly. The first major surface of the encapsulated device assembly includes the package substrate. In a further aspect, drilling the hole from one of the first or second major surface includes drilling a hole through the package substrate from the first major surface. A still further aspect includes forming a first solder ball on the first major surface of the electronic device assembly after forming the encapsulant where the first solder ball is coupled to a signal contact on the package substrate, and forming a second solder ball on the contact surface of the conductive via. In another aspect, drilling the hole from the first or second major surface includes drilling the hole from the second major surface to the package substrate but not through the package substrate. In a further aspect, filling the hole with a conductive material further forms a conductive via electrically coupled with a single contact on the package substrate.

In another aspect of the above embodiment, drilling the hole from one of the first or second major surface toward the opposing major surface further includes drilling a hole through the opposing major surface, and filling the hole with a conductive material forms a through via further having a second contact surface at or near the major surface opposing the major surface from which the hole is drilled.

Another aspect of the above embodiment further includes placing a second electronic device assembly on the surface of the electronic device assembly from which the hole is drilled and forming an electrical connection between a signal contact on the second electronic device assembly and the contact surface of the conductive via of the electronic device assembly. In a further aspect, forming the electrical connection includes using a solder ball between the signal contact on the second electronic device assembly and the contact surface. In another further aspect, forming the electrical connection includes performing a solder reflow.

In another aspect of the above embodiment, the wire bond includes one or more of gold, copper, aluminum, and palladium. In another aspect of the above embodiment, the conductive material forming the conductive via includes a solder paste. Still another aspect of the above embodiment includes providing a lead frame that includes the one or more signal pads and a die pad, and placing the electronic device on the die pad. Forming the encapsulant further includes forming the encapsulant over the lead frame and around the sides of the lead frame. The first major surface of the encapsulated device assembly includes the lead frame.

Another embodiment of the present invention provides a packaged device assembly that includes: an electronic device; one or more signal pads electrically coupled to the electronic device by corresponding wire bonds; encapsulant over and around the electronic device, over and around the wire bonds, and over the signal pads, where the encapsulant forms an encapsulated region of the packaged device assembly and the encapsulated package device assembly includes first and second opposing major surfaces; and a conductive via extending from one of the first or second major surface through a wire bond of the corresponding wire bonds. The conductive via includes a contact surface at or near the major surface from which the conductive via extends and the conductive via electrically couples a contact surface with the wire bond.

In one aspect of the above embodiment, the packaged device assembly further includes a package substrate including the one or more signal pads. The electronic device is mounted on the package substrate. The first major surface of the encapsulated device assembly includes the package substrate. In a further aspect, the conductive via extends through the package substrate. A still further aspect includes a solder ball formed on the contact surface of the conductive via. In another further aspect, the conductive via extends to a signal contact on the package substrate. In still another further aspect, the conductive via extends from the second surface of the packaged device assembly.

Another aspect of the above embodiment provides for a stacked package assembly that includes the package device assembly, as well as a second packaged device assembly placed on the major surface of the packaged device assembly at which the contact surface of the conductive via is located, and an electrical coupling between the contact surface of the conductive via and a signal pad on the second packaged device assembly.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A method for packaging an electronic device assembly, the method comprising:
   electrically coupling an electronic device to one or more signal pads, wherein said electrically coupling is performed using corresponding wire bonds;
   forming an encapsulant over and around sides of the electronic device and over and around the wire bonds and signal pads to provide an encapsulated electronic device assembly, wherein the encapsulated electronic device assembly comprises a first and second opposing major surfaces;

drilling a hole from one of the first or second major surface toward the opposing major surface, wherein the hole severs a wire bond electrically coupling the electronic device to a signal pad of the one or more signal pads; and filling the hole with a conductive material to form a conductive via having a contact surface at or near the major surface from which the hole is drilled, wherein the conductive via is in electrical contact with severed ends of the severed wire bond, and the conductive via electrically couples the contact surface with the severed ends of the severed wire bond.

2. The method of claim 1 further comprising:

providing a package substrate comprising the one or more signal pads; and placing the electronic device in an area of the package substrate for the electronic device assembly, wherein said forming the encapsulant further comprises forming the encapsulant over the package substrate in the area for the electronic device assembly, and the first major surface of the encapsulated device assembly comprises the package substrate.

3. The method of claim 2 wherein said drilling the hole from one of the first or second major surface comprises drilling the hole through the package substrate from the first major surface.

4. The method of claim 3 further comprising:

forming a first solder ball on the first major surface of the electronic device assembly subsequent to said forming the encapsulant, wherein the first solder ball is coupled to a signal contact on the package substrate; and forming a second solder ball on the contact surface of the conductive via.

5. The method of claim 2 wherein said drilling the hole from one of the first or second major surface comprises drilling the hole from the second major surface to the package substrate but not through the package substrate.

6. The method of claim 5 wherein said filling the hole with a conductive material further forms the conductive via electrically coupled with a signal contact on the package substrate.

7. The method of claim 1, wherein said drilling the hole from one of the first or second major surface toward the opposing major surface further comprises drilling the hole through the opposing major surface, and said filling the hole with a conductive material forms a through via further having a second contact surface at or near the major surface opposing the major surface from which the hole is drilled.

8. The method of claim 1 further comprising:

placing a second electronic device assembly on one of the first or second major surface of the encapsulated electronic device assembly from which the hole is drilled; and forming an electrical connection between a signal contact on the second electronic device assembly and the contact surface of the conductive via of the encapsulated electronic device assembly.

9. The method of claim 8 wherein said forming the electrical connection comprises using a solder ball between the signal contact on the second electronic device assembly and the contact surface.

10. The method of claim 8 wherein said forming the electrical connection comprises performing a solder reflow.

11. The method of claim 1 wherein the wire bond comprises one or more of gold, copper, aluminum, and palladium.

12. The method of claim 1 wherein the conductive material forming the conductive via comprises a solder paste.

13. The method of claim 1 further comprising:

providing a lead frame comprising the one or more signal pads and a die pad; and placing the electronic device on the die pad, wherein said forming the encapsulant further comprises forming the encapsulant over the lead frame and around sides of the lead frame, and the first major surface of the encapsulated device assembly comprises the lead frame.

* * * * *